(12) United States Patent
Semerad et al.

(10) Patent No.: US 8,983,563 B2
(45) Date of Patent: Mar. 17, 2015

(54) HIGH TEMPERATURE SUPERCONDUCTING TAPE CONDUCTOR HAVING HIGH CRITICAL AMPACITY

(75) Inventors: Robert Semerad, Armstorf (DE); Werner Prusseit, München (DE)

(73) Assignee: Theva Dunnschichttechnik GmbH, Ismaning (DE)

( * ) Notice: Subject to any disclaimer, the term of this patent is extended or adjusted under 35 U.S.C. 154(b) by 185 days.

(21) Appl. No.: 13/812,940

(22) PCT Filed: Jun. 15, 2011

(86) PCT No.: PCT/EP2011/059956
§ 371 (c)(1),
(2), (4) Date: Apr. 15, 2013

(87) PCT Pub. No.: WO2012/013415
PCT Pub. Date: Feb. 2, 2012

(65) Prior Publication Data
US 2013/0210635 A1 Aug. 15, 2013

(30) Foreign Application Priority Data
Jul. 29, 2010 (DE) .......................... 10 2010 038 656

(51) Int. Cl.
*H01L 39/24* (2006.01)
*H01B 12/02* (2006.01)
*H01B 12/06* (2006.01)

(52) U.S. Cl.
CPC ............ *H01B 12/02* (2013.01); *H01L 39/2461* (2013.01); *H01B 12/06* (2013.01)
USPC ............................ 505/230; 505/237; 505/238

(58) Field of Classification Search
CPC .... H01L 39/143; H01L 39/248; H01L 9/2419
See application file for complete search history.

(56) References Cited

U.S. PATENT DOCUMENTS

| 5,434,126 A * | 7/1995 | Ichikawa et al. ............... 505/238 |
| 2001/0007707 A1 * | 7/2001 | Kinder et al. .................. 428/131 |

(Continued)

FOREIGN PATENT DOCUMENTS

| DE | 197 54 475 | 9/1998 |
| JP | 09-074232 | 3/1997 |

(Continued)

OTHER PUBLICATIONS

International Search Report for PCT/EP2011/059956, mailed Sep. 20, 2011.
Valentina, R.V. et al., "Growth of Chemical Solution Deposited Coated Conductors", IEEE Transactions on Applied Superconductivity, vol. 19, No. 3, (Jun. 1, 2009), pp. 3212-3215.

(Continued)

*Primary Examiner* — Colleen Dunn
(74) *Attorney, Agent, or Firm* — Nixon & Vanderhye P.C.

(57) ABSTRACT

The invention relates to a high temperature superconducting tape conductor having a flexible metal substrate that comprises at least one intermediate layer disposed on the flexible metal substrate and comprising terraces on the side opposite the flexible metal substrate, wherein a mean width of the terraces is less than 1 μm and a mean height of the terraces is more than 20 nm, and that comprises at least one high temperature superconducting layer disposed on the intermediate layer, which is disposed on the at least one intermediate layer and comprises a layer thickness of more than 3 μm. The ampacity of the high temperature superconducting tape conductor relative to the conductor width is more than 600 A/cm at 77 K.

10 Claims, 5 Drawing Sheets

(56) References Cited

U.S. PATENT DOCUMENTS

Figure 2:
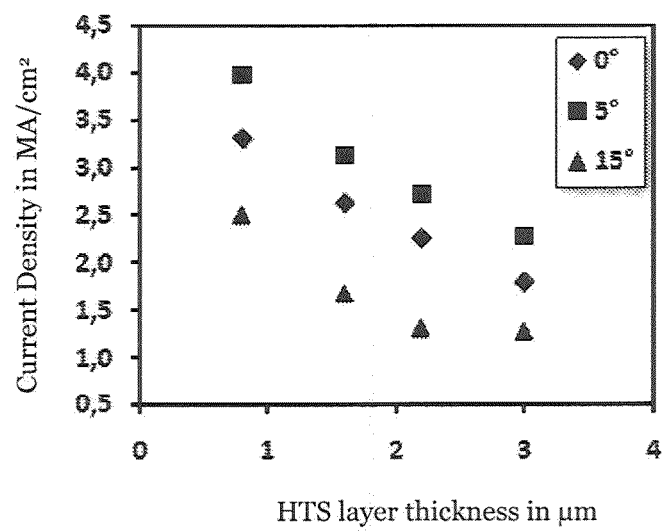

2008/0113869 A1    5/2008    Selvamanickam et al.
2009/0082211 A1*   3/2009    Nakayama et al. ........... 505/237

FOREIGN PATENT DOCUMENTS

JP    2002-075079    3/2002
JP    2008-251564    10/2008

OTHER PUBLICATIONS

German Office Action issued Apr. 24, 2014 for DE Application No. 10 2010 038 656.1.
"Dissertation von Andreas Lümkemann"; Technische Universität, Munchen, Germany; 2005.
English Translation of the IPRP and Written Opinion of the ISA mailed Feb. 14, 2013.
Japanese Office Action issued Oct. 2, 2014 for JP Application No. 2013-521029.

* cited by examiner

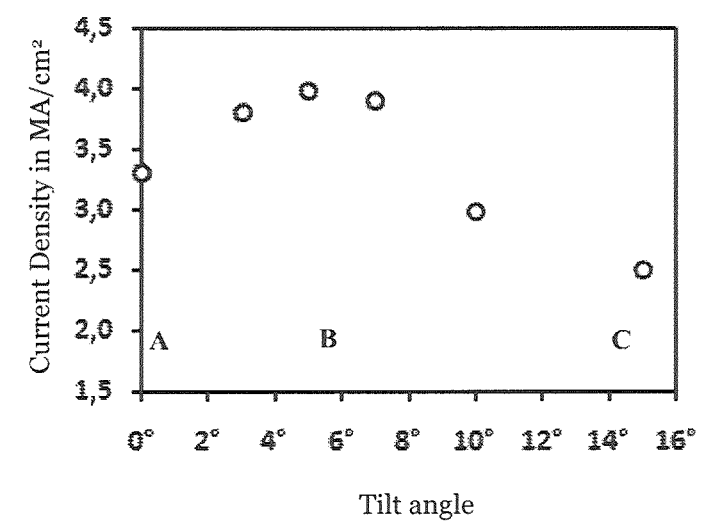
Fig. 1
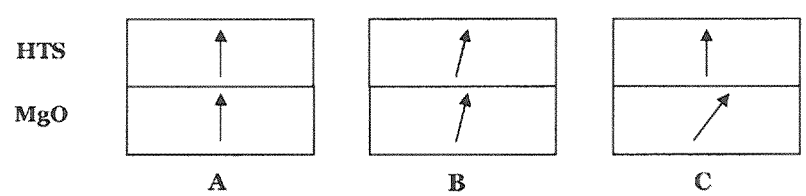

HIGH TEMPERATURE SUPERCONDUCTING TAPE CONDUCTOR HAVING HIGH CRITICAL AMPACITY

This application is the U.S. national phase of International Application No. PCT/EP2011/059956, filed 15 Jun. 2011, which designated the U.S. and claims priority to DE Application No. 10 201 0 038 656.1, filed 29 Jul. 2010, the entire contents of each of which are hereby incorporated by reference.

1. TECHNICAL FIELD

The present invention relates to a high temperature superconducting tape conductor.

2. PRIOR ART

In the following a superconducting conductor configuration is named as high temperature superconducting tape conductor (HTS tape conductor) or also only as tape conductor that bases on a flexible metal substrate foil on which on one or more intermediate layers at least one HTS layer is superimposed. The one or more intermediate layers—that are also named as buffer layers—may for example effect as diffusion barrier or may provide a crystalline orientation and may serve as epitaxy-support for the HTS layer.

HTS tape conductors are in the electric- and energy-technology a common conductor material from which wires, cables or loops or coils are made of. The characteristic parameter for the evaluation of the quality and respectively to express the capability of HTS tape conductors is the critical ampacity up to which the conductor can transfer electric current without any observable resistance. A high technical current density, i.e. the current, which is transferred by the entire conductor cross section, means in that context that very high currents and powers can be transferred on a very small space (cross section).

The higher the current density is the more compact electric systems can be designed like cables, motors, coils etc. Moreover, in alternating current applications, the low alternating current losses that are generated in the superconductor depend strongly on the quotient $I/I_c$, that means the transfer current I to the critical current $I_c$ (Supercond. Sci. Technol. 22 (2009) 055014; Physica C 445-448 (2006) 712). Thus, a doubling of $I_c$ leads for the same transfer current load to a reduction of the alternating current losses about one order of magnitude. Also the price of HTS tape conductors is commonly related to the performance and is declared in EUR per kiloamper-meter (€/kA·m). Since the ampacity is only given by the HTS layer, an improvement of this layer leads to a reduction of performance-related manufacturing costs, since the costs of the other manufacturing steps (substrate, intermediate layers etc.) remain unchanged. Thus, the improvement of the critical transfer current is a central aim during the manufacturing of application-optimized HTS tape conductors.

A direct obvious measure would be the increase of the HTS layer thickness so that the effective HTS conductor cross section increases and thus the ampacity increases linearly with the layer thickness. But in practice it is observed that the specific ampacity of HTS layers decreases with increasing layer thickness up to the point, when an additional layer thickness does not lead to any further increase of the ampacity. The additional layer thickness is thus only dead material that does not help anything for the current transfer. Thus, qualitatively high-value HTS layer thicknesses are currently limited to thicknesses of less than 3-5 µm.

High temperature superconductors (HTS) are oxide-ceramic superconductors, wherein $CuO_2$-layers are central elements in the crystalline fabric. Common representatives of this material class are compounds with the chemical molecular formula $RBa_2Cu_3O_7$, in the following shortened named as RBCO, wherein R stands for an element out of the group of noble earths (for instance Dy, Gd, Ho etc.) or for Yttrium (Y).

An unmistakable feature of the HTS is its strong crystalline anisotropy. The $CuO_2$-planes are spanned in the crystal by the so called a-b-axis, while the direction perpendicular thereto is named as c-axis. The crystalline anisotropy effects on nearly all physical and electric characteristics of the HTS, like amongst others the superconducting ampacity, the diffusion coefficients along defined directions and the crystalline growing speeds.

When HTSs are deposited by physical or chemical methods as thin layers on a substrate, they consist of many individual crystallites or grains. When their crystalline orientation varies strongly from each other, the large-angle grain boundaries impede the superconducting current flow in that the critical ampacity is several orders of magnitude below the intrinsic ampacity of the single grains. Thus, the grains in HTS tape conductors with high ampacity have to be arranged to each other in a variation range of some degrees.

Thus, with common coating technologies b-axially textured HTS layers are manufactured, wherein the a-b-axes are arranged in fixed relationship to the underlayer parallel to the substrate surface and the c-axis is perpendicular thereto. It is spoken of c-axis-orientation of the layer. Commonly this arrangement is achieved also on a microscopic length scale by means of an epitaxial process that means an appropriate underlayer defines the growing direction of the crystalline HTS layer. Appropriate underlayers are for instance monocrystalline discs of sapphire, MgO, $LaAlO_3$ etc., wherein its crystal-symmetry and lattice constant is adapted to the HTS layer. Also some metals can be preprocessed by mechanical deformation and removal in that a thin metal sheet is generated with grains that are arranged well to each other. This is prior art as the so called RABiTS-method (U.S. Pat. No. 5,964,966).

US 2008/0113869 A1 discloses a superconducting member, that comprises a substrate, wherein the substrate is not textured and comprises a nickel-based alloy, which comprises primarily nickel and not less than 20 weight-% of an alloy element and wherein the substrate is essentially free of Molybdenum and Manganese. Furthermore, the superconducting member comprises a buffer layer, that is arranged on the substrate and a high temperature superconducting layer (HTS) that is attached on the buffer layer.

But the crystallites in many metals and alloys cannot be aligned in such a simple manner. In these cases, methods are chosen in order to align a buffer layer that is deposited directly or with intermediate layers onto the metal substrate by appropriate process control in order to provide an epitaxial-compliant support for further layers. By doing so, amongst others also the growth of bi-axial-oriented HTS layers becomes possible. In the technology, in general two PVD methods (PVD: Physical Vapor Deposition) are used: "Ion Beam Assisted Deposition" (IBAD) or "Inclined Substrate Deposition" (ISD). In the IBAD method, an ion beam that is directed during the deposition additionally onto the layer effects the desired orientation (EP 0 872 579, U.S. Pat. No. 5,432,151), and contrary to that in the ISD-method the orientation is generated by growing selection, when the substrate is tilted against the direction of arrival of the arriving coating material (EP 0 909 340, EP 0 669 411).

DE 197 54 475 A1 of the applicant discloses a coat material with in that sequence an amorphous or polycrystalline substrate, a textured buffer layer and an oriented thin layer, wherein between the buffer layer and the thin layer at least one cover layer is enclosed. With the at least one cover layer it is effected that gaps and unevennesses in the buffer layer, which are caused by manufacturing, are compensated so that the oriented oxidic thin film comprises a high quality according to the surface that is provided for its epitaxial growth.

With perfect epitaxy, the critical current density in the HTS layer should be completely independent of the layer thickness and high transfer currents could be simply achieved by raising the thickness of the HTS layer. But in practice a strong degradation of the critical current density is observed with increasing layer thickness so that it up to now merely succeeds to achieve a significant increase of the transfer current in thick HTS layers of more than 3-5 µm. Some possible main reasons for this strong layer thickness dependency are explained briefly in the following.

Different thermic expansion coefficients between the substrate and the HTS layer may cause that the HTS layer, which is commonly deposited with high temperatures>650° C., is stressed during cooling down. The most common oxidic substrate materials like for instance sapphire, $LaAlO_3$, YSZ (Yttrium-stabilized zirconiumoxide), but also silicon comprises significantly lower expansion coefficients than the HTS layer so that it is loaded with tensile stress. Starting at a specific layer thickness, this tensile stress is relaxed by cracks, wherein the critical current degrades about several orders of magnitudes or no continuous superconducting current path leads through the layer anymore (W. Prusseit et al., Physica C 201, (1992), 249-256).

From the literature approaches are known to solve this problem by the induction of a specific porosity in the HTS layer. Porous growing allows the layer to absorb stresses in a better way or to stop the expansion of cracks by pores. On sapphire, the critical layer thickness of for instance $YBa_2Cu_3O_7$ is reached at about 300-400 nm. Porosity can be achieved for instance by a Yttrium-surplus in the film (K. Develos-Bagarinao, H. Yamazaki, in: YBCO Superconductor Research Progress, Ed.: Li-Chun Liang, S53-92, Nova Science Publ. (2008), ISBN: 978-1-60456-083-1) or by epitaxial growth on the substrate that is sliced and polished with some degrees discrepancy from the perfect epitaxy-orientation (Appl. Phys. Lett. 86 (19) (2005) 192507, IEEE Trans. Appl. Supercond. 17, (2007), 3459-3462). The latter means that the crystal axis (c-axis) deviates typically about 1°-6° from the substrate perpendicular. By doing so, it was possible to manufacture crack-free $YBa_2Cu_3O_7$-layers on sapphire with a thickness of up to 1 µm. But the porosity also leads to losses in the current density, so that after deductions merely an improvement of the transfer current was observed.

On metallic substrates, the effect of the thermal expansion is commonly not important, since the expansion coefficients of the metals are higher than the ones of the HTS layer, so that it is only loaded with compressional stress and no crack building appears. Therefore, in the HTS layers of tape conductors by principal even layer thicknesses of several micrometers can be realized. But also here a strong dependency of the critical current density on the layer thickness is observed (Appl. Phys. Lett. 75, (1999), 3692-3694).

Characteristics and reasons for these dependencies are often based on the manufacturing method. In fact the epitaxial growth of the layer is never perfect, but growing defects appear like for instance disoriented grains (mostly a-axis-grains) or impurity phases. When they are once generated, they will not disappear during the further layer growing anymore. Moreover, they accumulate themselves in the layer or grow to such a growth, so that they effectively hinder the current flow. In RBCO the generation of a-axis-oriented grains is often observed, since the lattice parameter in c-direction is in general exactly 3 times the a-axis-lattice parameter and for both orientations comparably similar epitaxy-conditions are fulfilled. Since also the crystal growth speeds in HTS are strongly anisotropic and crystallites in a-direction grow much faster than in c-direction, these grains can be observed in the layer as encased nails or small plates that hinder the current flow like walls. With growing layer thickness for constant nucleation rate more and more of such grains are generated, which finally build a net of walls that are perpendicular to each other because of their longitudinal growth. Thus, further layer growth only leads to a dead surface-near layer that does not add any contribution to the transfer current.

When one wants to achieve higher currents by increasing the thickness of the HTS layer, it is thus important to suppress these defects or to limit their growth rigidly. For this are only two successful approaches known in the prior art. On the one hand it was tried to overgrow or to compensate the defects that are generated in the HTS layer by thin $CeO_2$— intermediate layers by a periodic sequence of double layers consisting of $YBa_2Cu_3O_7$ (500 nm) and $CeO_2$ (30 nm), so that for the succeeding HTS layer again a support is provided that is as perfect as possible (Appl. Phys. Lett. 87 (2005), 162505). With these methods, tape conductor pieces with HTS multi layers, which comprise a thickness of 3.5 µm and a critical ampacity of 1400 A/cm (at 75 K), were able to be manufactured. But the alternating deposition of two components figures a complication in production-technological manners and leads to an undesired cost factor.

On the other hand, it was tried during the band coating to maintain the temperature during the HTS coating as constant as possible by an in particular homogeneous cavity radiation heater and to provide ideal conditions for the growth by that measure. By this arrangement GdBCO layers with a thickness of up to 6 µm with about moo A/cm (at 77K) could be deposited. But the use of this heater-concept is limited to the herein used PLD-coating method (PLD: Pulsed Laser Deposition) since this method only needs a relatively small coating opening in the wall of the heater. However, the PLD method is rather an expensive laboratory technology and seems to be inappropriate for a large scale cost effective tape conductor manufacturing.

A further general problem of thick HTS layers consists in its sufficient oxygen load. During the layer manufacturing at high temperatures>650° C. initially the semiconducting tetragonal $RBa_2Cu_3O_6$ phase is generated. Not till cooling down in oxygen a seventh oxygen atom is integrated in the unit cell as a consequence of a structural phase transition, what leads to superconducting, orthorhombic $RBa_2Cu_3O_{7-\delta}$, wherein a small oxygen deficit $\delta<0.15$ does not have any negative consequences on the ampacity and thus can be accepted. But during the cooling down in the oxygen it is important to load the layer sufficiently with oxygen in its entire thickness down to the support. Thus, the oxygen diffusion in the HTS layer is also highly anisotropic. So, for instance in YBCO, the diffusion parameter $D_c$ in c-direction is up to 4 to 5 orders of magnitude smaller than the diffusion parameter $D_{ab}$ in ab-direction. (J. Appl. Phys. 69 (1991), 7189-7201). Although even perfect c-axis-oriented HTS layers are pervaded with grain borders caused by the growing, which are perpendicular to the surface, the slow diffusion speed in c-direction is very important for the process times during the final loading with oxygen. When the loading time is not significantly increased for thick films so deeper areas of the HTS layer are not sufficiently loaded with oxygen and thus cannot be used for the current transfer. The complete loading of thicker layers can possibly require extremely long process times, what limits the output per production line in the production.

Thus, it is the problem of the present invention to provide a HTS tape conductor with a high ampacity that avoids at least in parts the above discussed disadvantages.

3. SUMMARY OF THE INVENTION

According to one embodiment of the present invention this problem is solved by a HTS tape conductor according to claim 1. In one embodiment, the high temperature superconducting tape conductor with a flexible metal substrate comprises at least one intermediate layer that is arranged on the flexible metal substrate and which comprises on the side that is opposed to the flexible metal substrate terraces, wherein a mean width of the terraces is less than 1 µm and a mean height of the terraces is more than 20 nm, and at least one high temperature superconducting layer that is arranged on the intermediate layer, which is arranged on the at least one intermediate layer and comprises a layer thickness of more than 3 µm, and wherein the ampacity that is related to the conductor width of the high temperature superconducting tape conductor is higher than 600 A/cm at 77 K.

The defined HTS tape conductor can also carry very high transfer currents even for high layer thicknesses. This is achieved in that during the manufacturing of a HTS tape conductor according to the invention the growing mode of the HTS layer is controlled in that the most important ones of the above described reasons for a degradation of the critical current density for increasing layer thicknesses are suppressed. In particular a terrace-like HTS-growing-mode impedes that the defects that are encased in the superconducting a-b-plains can be overgrown. It has proven to be in particular advantageous when the a-b-plains of the HTS layer comprise a tilted angle to the substrate surface. The terrace growing of the layer allows the increase of the HTS layer thickness to more than 3 µm without having to have to accept significant performance losses in view of the achieved current density. By doing so, the ampacity of HTS tape conductors can be significantly increased in view of the prior art. A terrace can also be named as a facet, that means as a—except for deviations that can be disregarded in view of the epitaxial layer growing of the HTS layer—plain surface of the intermediate layer.

In a further aspect, the high temperature superconducting layer comprises a layer thickness of 5 µm to 10 µm.

According to another aspect, the mean height of the terraces of the at least one intermediate layer comprises a range of 50 nm to 200 nm.

In a further aspect, the maximum mean height of the terraces does not exceed 20% of the layer thickness of the high temperature superconducting layer.

In still another aspect the mean width of the terraces of the at least one intermediate layer is smaller than 400 nm.

According to a further aspect, the metal substrate comprises a sheet made of Hastelloy with a thickness of up to 200 µm.

In another advantageous aspect, the at least one intermediate layer comprises a magnesium oxide layer with a thickness of 1.5 µm to 3.5 µm.

According to a further aspect, the high temperature superconducting layer comprises a $RBa_2Cu_3O_7$-layer, wherein R is one element out of the group consisting of the elements Dysprosium (Dy), Gadolinium (Gd), Holmium (Ho) and Yttrium (Y), in particular a high temperature superconducting layer consisting of $DyBa_2Cu_3O_7$.

In another aspect, the surface of the terraces is essentially parallel to the metal substrate plane.

According to a further aspect, the terraces of the at least one intermediate layer are manufactured by anisotropic etching.

4. DESCRIPTION OF THE DRAWINGS

Figure 3:
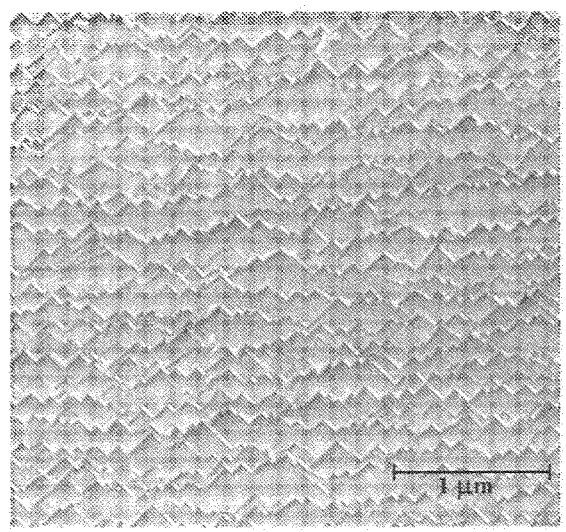
Figure 4:
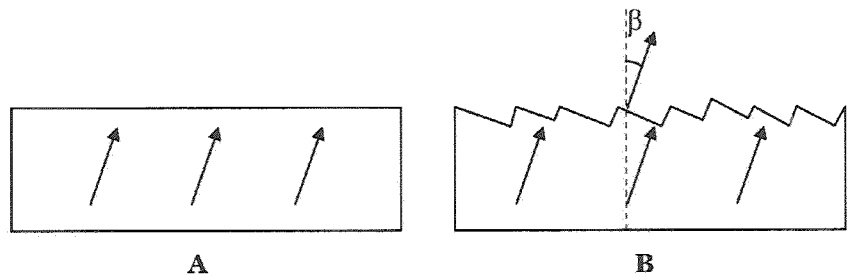
Figure 5:
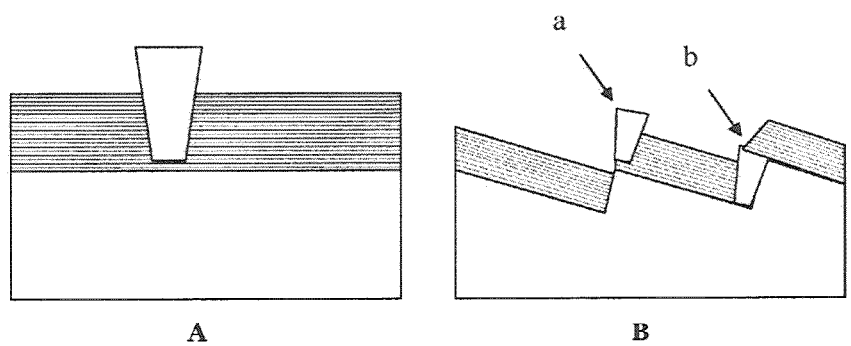
Figure 6:
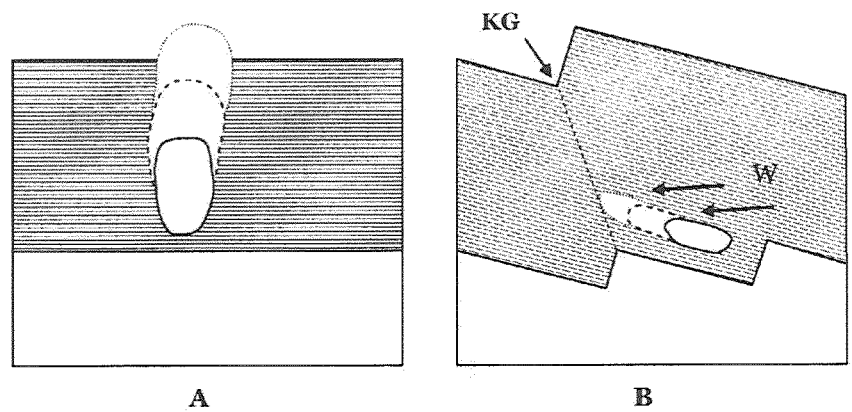
Figure 7:
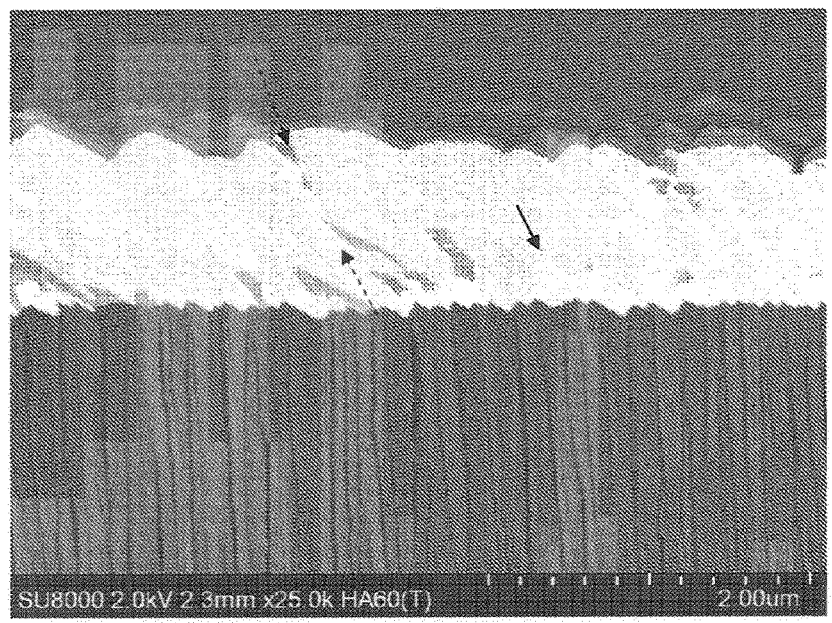
Figure 8:
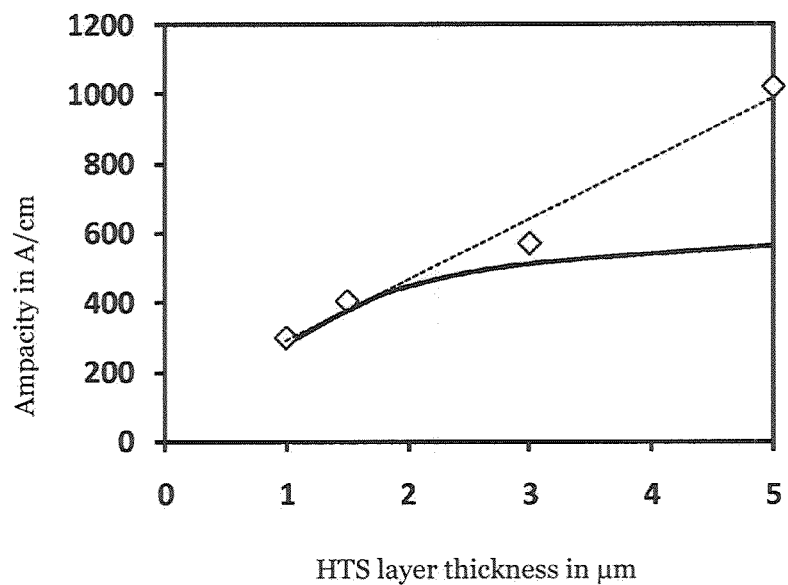
Figure 9:
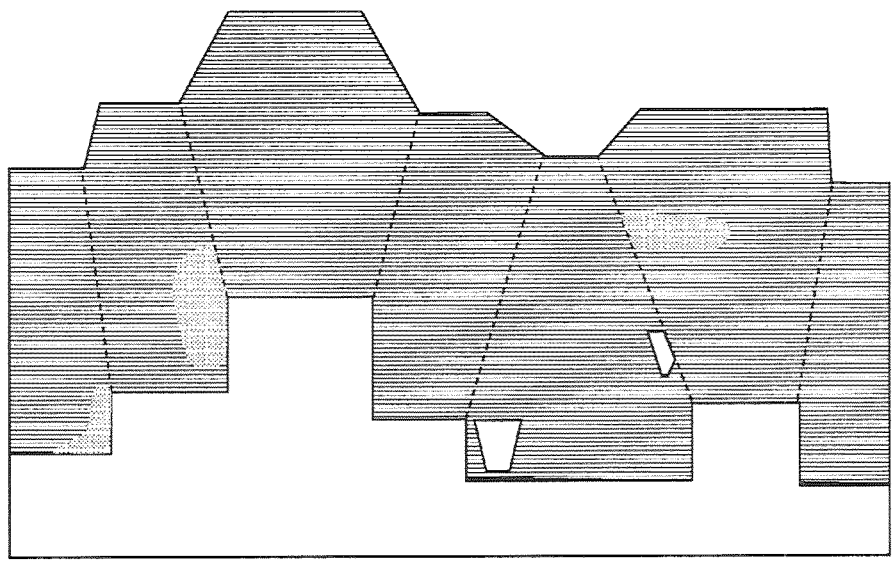

In the following detailed description, currently preferred embodiments of the invention are described with reference to the figures, wherein shows:

FIG. 1 the developing of the critical current density of YBCO-layers with a thickness of 0.8 µm as a function of the tilt angle of the MgO substrate and shows the relationship of the crystallographic orientation in the substrate and the HTS layer;

FIG. 2 the critical current density of YBCO layers of different thicknesses on MgO substrates with different tilt angle;

FIG. 3 an electron-microscopic picture of a staged, tilted MgO surface that was manufactured by the ISD method;

FIG. 4 cross section sketches perpendicular to the surfaces of crystalline supports with tilted crystal axis, A) an angular cut and polished monocrystal, B) a layer that is manufactured with the ISD method, wherein both the directions of the c-axis and the perpendicular of the terraced surfaces deviate about the angle β from the substrate perpendicular;

FIG. 5 a schematic cross section of the growing of a-axis-oriented grains in c-axis-oriented HTS layers on a plain support (A) and on a staged support (B);

FIG. 6 a schematic cross section, wherein growing and encasement of impurity phases in c-axis-oriented HTS layers on a plain support (A) and on a staged support (B);

FIG. 7 an electron-microscopic cross section picture of a DyBCO-layer on an ISD-MgO-layer of a HTS tape conductor;

FIG. 8 the ampacity of DyBCO layers of different thicknesses in tape conductors with ISD-MgO-buffer layer; and FIG. 9 a schematic cross section which shows the growing and the encasement of impurity phases and a-axis-grains in c-axis-oriented HTS layers on a staged support without crystallographic tilting.

5. DETAILED DESCRIPTION OF PREFERRED EMBODIMENTS

In the following, initially the term "critical current" is explained and after that currently preferred embodiments of a HTS tape conductor according to the invention are explained in more detail.

Superconductors are able to transfer electric direct current up to a specific critical current density without losses. When this critical value is reached or exceeded, observable electric losses appear caused by the movement of magnetic flow lines in the superconductor. Commonly in technology a 1 µV/cm-criterion is used in order to define the reaching of the critical current density, i.e. the current related to the cross section of the HTS layer. The critical transfer current results from the product of the critical current density and the HTS layer cross section. In the context of HTS tape conductors often also the critical current in A/cm is used that is related to the width of the conductor. When nothing else is indicated, the values relate to a measurement temperature of 77 K. The technical current density finally is the current density of the finished technical tape conductor and results from the quotient of the critical amperage and the cross section of the entire conductor including the substrate and other layers and laminations, respectively.

Independent from the measures that are known from the prior art like the multi-layer deposition or the exact temperature control also the growing mode of the HTS layer can be controlled in that the most important of the above described reasons for a degradation of the critical current density with increasing layer thickness are suppressed. This is achieved according to the invention by a terrace-like layer growing. It proves to be in particular advantageous, when the a-b-planes of the HTS layer are arranged in a tilted angle against the substrate surface. In particular good results are achieved when this tilt angle is between 5° and 30°.

For the manufacturing of HTS tape conductors, such a support can be for instance provided by the ISD method according to the patent EP 0 909 340 with its tilted MgO buffer layer. In order to examine the influence of the deviation from the (100)-orientation and the surface morphology of MgO substrates on the HTS layer growing separated from each other, in a first step coating experiments were conducted on disoriented, polished MgO mono-crystals. The tilt angle is given in view of the [001]-direction, so that 0° labels a perfect (100)-oriented MgO substrate. The tilting is carried out in [110]-direction, that means in the direction to the border of the cubic MgO unit cell.

On MgO substrate with differing disorientation YBCO films were deposited by electron beam vaporization of YBCO granulates according to EP 1 558 782. The results for YBCO layers with a layer thickness of 0.8 μm are summarized in table 1. In the first line, the tilt angle of the MgO substrate in view of the [001]-direction, is given, and in the second line the tilting of the YBCO-c-axis in view of the substrate perpendicular is given that is determined by X-ray diffraction. The quality of the superconducting layer is characterized by the inductively determined critical current density in the third line.

TABLE 1

HTS coating results on tilted MgO substrates

| MgO tilt angle | 0° | 3° | 5° | 7° | 10° | 15° | 20° |
|---|---|---|---|---|---|---|---|
| YBCO tilt angle | 0° | 3° | 5° | 7° | 10° | 0° | 0° |
| jc (77K) in MA/cm$^2$ | 3.31 | 3.81 | 3.98 | 3.91 | 2.98 | 2.5 | <1* |

Up to a substrate tilting of about 10° the HTS layer is obviously able to follow the pre-setting of the substrate, which is expected in the analog tilting of the c-axis. But when the tilt angle is further increased, the HTS layer does not follow the support any more. The strong disorientation of the substrate surface is obviously compensated by the integration of stages so that the c-axis of the HTS layer is able to be perpendicular to the substrate. For a very strong disorientation of 20°, the result (marked with a *) depends strongly on the direction of the tilting, since it is possible in specific directions that new advantageous epitaxy-conditions can result.

In general for very large angles a c-axis-texture is still observed, but X-ray pole figures also show that in the HTS layer inside the substrate plain no clearly defined crystal orientation is present anymore. The result is again graphically shown in FIG. 1. The critical current density increases for small tilt angles significantly, reaches between 5°-7° a maximum and decreases drastically the bigger the angles are. The orientation relationships between the substrate and the HTS film are shown in the area (A, B, C) below.

While obviously dislocations and pores work for slight tilting as additional pinning centers for the flow lines, which increase the critical ampacity, the kind and the increasing density of the defects at bigger angles to a significant impairment of the crystal grid and the superconductor characteristics. The tests prove that a disorientation of the support allows up to a specific degree an increase of the critical current density. But in MgO substrates a tilting of more than 5°-7° seems not to be prospering.

As next, the effects of the tilting on the layer thickness growth and the quality of thick HTS layers is examined. Therefore, HTS layers of a thickness of up to 3 μm were deposited on all MgO substrates of the test lot. The result is exemplarily shown in FIG. 2 for three tilt angles. Although the tilting comprises the above described positive effect on the absolute values of the critical current density, they decrease continuously with increasing layer thickness independent from the fact, whether the substrate is tilted or not. A positive effect of the substrate tilting on the layer thickness growth was also not observed.

Besides the desired disorientation of mono-crystalline substrates by angular cutting and polishing, for instance the ISD method is a further option to provide a disoriented support. In this method, a buffer layer material, preferably MgO, is deposited under an inclined angle on a polycrystalline or amorphous support. Herein, characteristic growing columns are generated wherein their (100)-surfaces are declined in the direction of the arriving material. By growing selection the MgO surface consists of bi-axially oriented crystallites that comprise the same orientation inside an angle deviation range of 5°-15° in the plane. The [001]-direction of the resulting MgO surface is herein depending on the arrival angle tilted by 15°-30° in view of the substrate perpendicular. Thus, this is a relatively strong tilting. The surface of this MgO layer differs by a characteristic faceting- or terrace-structure significantly from the above described angular cut—but plain—mono-crystals. It is reminiscent of a shingle roof and is shown in the electro-microscopic top view in FIG. 3.

FIG. 4 shows in a schematic cross section the characteristic difference between two substrates with tilted orientation (arrows), but a plain surface (A) and a surface that is built by terraces, which are tilted around the angle β in view of the substrate perpendicular (B).

If such a terraced epitaxy-support is used for the HTS growth, this growth differs significantly and in characteristic manner from the HTS growth on a substrate with plain surface. While the HTS layer on a plain substrate has to compensate at the border area pin holes caused by dislocation in order to follow the tilting or—for large angle deviations—to align from the ideal epitaxy-support completely independently, the layer can germinate and grow on the single facets (terraces) of the terraced surface in some kind of a micro-epitaxy like on an optimum oriented (not disoriented) mono-crystal. The surface works as a collection of small, angular arranged but otherwise perfect c-axis oriented mono crystals. The HTS layer follows the tilting that is strong relative to the global substrate plane. This HTS growth is currently characteristic in the tape conductor manufacturing for the ISD method and can be proven in a very simple way, for instance by X-ray diffraction.

The difference in principle in the effect of the growing modes on the generation and the growing of frequent defects in HTS layers is shown in FIGS. 5 and 6. On a plane substrate (FIG. 5A), wherein the c-direction lies in the substrate plane, a-axis-grains are able to grow out of the layer in a trapezoid-shape because of the faster growing speed in a-b-direction and is thus not limited in its size.

Contrary to that, HTS grains that germinate on the terraces of a staged surface with sufficient stage height (FIG. 5B) are in general limited by the width of the terraces. The terrace growth continues in the HTS layer. The finite width of the terraces causes in particular that the HTS crystallites cannot become arbitrarily large, but are limited by the shoulders of the next stages. The latter ones also effect the defect growth in the HTS layer. When stick-shaped a-axis-oriented grains nucleate, also their expansion is limited by these stages, FIG. 5B (a). Moreover, they can be overgrown by the faster growing in a-b-direction from above arranged stages, FIG. 5B (b) and herewith terminated.

It is quite similar in the context of encased impurity phases that means chemical depositions, wherein its chemical structure differs from the surrounding HTS layer. This is shown in the schematic cross section in FIG. 6. When such chemical depositions come up in a HTS layer on a plain support (FIG. 6A), they often will not be overgrown by the surrounding HTS layer (due to different free surface energy) and encase in the course of the ongoing layer growth additional material in the upward direction (shown by broken and dotted lines) so that they often protrude upwards out of the HTS layer. These mostly copper-rich chemical depositions are well known in RBCO layers. But when the HTS layer grows on a staged substrate in a terraced manner (FIG. 6B) the chemical deposition is overgrown from the side by the faster growing in a-b-direction (angular plains) from higher located stages, as shown by the arrows (W). The deposition of new material is carried out sidewards (as shown by broken and dotted lines) so that the encasement is carried out along the a-b-planes and does not cross the layer in the vertical direction. When the chemical deposition comes to a shoulder, which leads in the HTS layer to a grain border (KG), its growing can be completely stopped by that. This can be very impressively seen in the electron microscopic cross section of FIG. 7—a HTS tape conductor sample that was manufactured with the ISD method.

The picture shows with 25.000-fold magnification in the lower area the characteristic column growth of the MgO layer and the staged border area to the brighter HTS layer. In the HTS layer bright and dark encasements of impurity phases (arrow) can be seen that expand as described in FIG. 6B angularly along the tilted HTS planes and are stopped in the most cases at grain borders, for instance highlighted by broken arrows.

On the HTS layer furthermore a darker, thin silicon layer can be seen that was needed for the preparation of the cross section, but has no other meaning. Also, the HTS surface comprises clear stages what proves the terrace growing. The tilt angle of the HTS layer is identical with the one of the MgO terraces. But the terrace width in the HTS layer is significantly higher. This indicates that smaller stages with lower stage height in the MgO can be overgrown and compensated by the HTS layer because of the fast a-b-growing speed and lateral diffusion.

The tilted growing has also in view of the oxygen loading advantages because the a-b-planes with their high oxygen diffusion coefficients are not oriented parallel to the surface but are open in the direction towards the layer surface. This facilitates the diffusing in of oxygen in deeper areas of the HTS layer up to the buffer-border plane and shortens the process times significantly.

The above mentioned observations and results lead to the awareness that many of the common degradation mechanisms are suppressed or at least strongly modified as long as a tilted terrace growing is ensured in the HTS layer. With this growing mode it is thus possible to manufacture HTS layers with high critical transfer currents. As proof, a layer-thickness-series of DyBCO layers was manufactured on 2.5 μm thick MgO buffer layers that were applied by the ISD method according to patent EP 0 909 340 and which comprise a tilting of the [001]-direction of 25° in view of the substrate perpendicular. An electro-polished sheet made of Hastelloy C 276 with a thickness of 90 μm served as substrate. The DyBCO layers were deposited by electron beam vaporization of DyBCO-powder at a substrate temperature 700° C. A silver contact layer with a thickness of 500 nm on the surface served as low-ohm-contact and current inducer into the HTS layer. An X-ray diffraction measurement showed the same tilting of the HTS-c-axis of 25° in view of the substrate perpendicular like in the MgO layer according to the forecast. Out of the tape conductor samples, each with a length of 10 cm and a width of 1 cm, several short pieces were cut out and were structured photolithographically with measuring bridges comprising a width of 1.1 mm. By means of these bridges and by four-point-measuring, the critical transfer current in a bath of liquid nitrogen (77 K) was determined. The results of this test series are summarized in table 2 and in FIG. 8.

TABLE 2

Transfer currents in thick DyBCO layers on MgO that was manufactured by means of the ISD method.

| | HTS layer thickness in μm | | | |
|---|---|---|---|---|
| | 1.0 | 1.5 | 3 | 5 |
| Transfer current in A/cm | 300 | 405 | 570 | 1018 |
| Critical current density in MA/cm$^2$ | 3.0 | 2.7 | 1.9 | 2.0 |

In deed a significant increase of the transfer current was observed for increasing layer thickness in these samples even for HTS layer thicknesses of significantly more than 3 μm. In HTS layers with a thickness of 5 μm, transfer currents, which are normalized on the width, of more than 1000 A/cm were measured, what is a world record for homogeneous HTS layers. A plotting of the measurement values in FIG. 8 and the comparison with the typically observed behavior (solid curve) shows that the ampacity of the HTS layers increases linearly within the deviation of the measurement values with the layer thickness (broken best-fit line) and that the common degradation mechanisms are strongly suppressed. Since there was not reached any upper limit with this layer thickness series, it is expected that the ampacity can be further improved by thicker HTS layers.

It is the technical teaching from these tests that HTS tape conductors with extremely high ampacity can be manufactured, for instance by inducing a terrace growing in the HTS layer by an appropriate support and, by doing so, thick HTS layers with a thickness of preferably more than 3 μm are manufactured, in particular preferred with layer thicknesses in the range of 5-10 μm. In HTS tape conductors that are manufactured in that way, transfer currents related to the conductor width can be achieved of more than 600 A/cm at 77 K, in particular preferred of more than 1000 A/cm. In these tape conductors the tilting of the c-axis around about 5°, preferably between 20° and 30° in view of the substrate perpendicular can be proven by X-ray diffraction as characteristic signature. A preparation of a cross section shows undoubtedly stages of the border plane between buffer layer and HTS layer, wherein the mean stage height is at least 20 nm.

An appropriate exitaxy-underlayer can be provided for example by the ISD method. But also other methods are imaginable, that can generate a tilted and staged buffer layer as exitaxy-underlayer, exclusively by a corresponding process control or in combination with a substrate tilting during the coating. In this context, the use of a supporting ion beam and respectively modifications of the known IBAD method might be possible.

Although the tilting of the c-axis in view of the substrate perpendicular comprises significant advantages in view of the defect growth and the oxygen loading, the above mentioned expectation allows the conclusion that the tilting is not imperatively necessary for suppressing and respectively limiting of the defect growth. Many of the above discussed mechanisms for the lateral overgrowing and for limiting of grain growing only requires stages in the surface that are transferred into the HTS film. This is shown schematically in FIG. 9 and in recognition of FIGS. 5 and 6. Grain borders start from the stages in the support (broken lines). Chemical depositions (grey) or a-axis-grains (white) can be overgrown starting from higher arranged levels and at terrace stages (grain borders). Contrary to the tilted terraces, where no specific terraces are, defects may appear perpendicularly until they exceed over the surface in this case on heights that are arranged in the highest levels or on islands likewise on plain surfaces. Stages or terraces, which are parallel to the surface, can be generated in the substrate or in at least one buffer layer that is arranged between the substrate and the HTS layer for instance by anisotropic etching (dry or wet chemical).

Independent from the manufacturing of the terraced epitaxy support, the width of the terraces and the height of the stages have to fulfill specific requirements in order to guarantee the effectively in view of the layer- and defect-growth. If the terrace width is significantly higher than the typical grain sizes that are caused by the growing in the HTS layer, terraces do not figure any limitations of the growing and remain without effect. Typically, the expected grain sizes for a-axis- or c-axis-growing are in the order of magnitude of 1 µm. Thus, the mean terrace width is allowed to comprise a width of 1 µm as maximum. Preferably, it is less than 400 nm.

For tilted terraces, the mean terrace width b is directly correlated via the tilt angle β with the mean stage height h=b·tan β. Thus, in the angle range between 5° and 30° the maximum mean stage height is between 85 nm and 600 nm. Independent from the tilting, the stages must comprise in addition a specific minimum height, which is given by the size of typical defect nuclei and the mobility of deposited layer components on the surface. If the germinating defect is higher than the stage or can it become easily overgrown, it remains without any effect. Typically, the stage height of effective ISD surfaces is in the range of 50 nm-200 nm. Since also smaller stages inside large terraces appear, which do not have any direct effect, the lower border for the minimum stage height can be defined with about 20 nm. Good results in the thickness growing of HTS layers are already achieved with mean stage heights of 100 nm. If the stages become—contrary to that—very high, they effect negatively on the current flow in the HTS layer. If the stage height can be compared with the layer thickness, the layer grows discontinuously and is not closed. A maximum stage height of up to 20% of the desired HTS layer thickness seems to be prospering, because by doing so the negative effect on the transfer characteristic of the HTS layer remains in a reasonable scope.

The invention claimed is:

1. High temperature superconducting tape conductor with a flexible metal substrate, comprising:
   a. at least one intermediate layer that is arranged on the flexible metal substrate and which comprises on the side that is opposed to the flexible metal substrate terraces, wherein
   b. a mean width of the terraces is less than 1 µm and a mean height of the terraces is more than 20 nm, and
   c. at least one high temperature superconducting layer that is arranged on the intermediate layer, which is arranged on the at least one intermediate layer and comprises a layer thickness of more than 3 µm, and
   d. wherein the ampacity that is related to the conductor width of the high temperature superconducting tape conductor is higher than 600 A/cm at 77 K.

2. High temperature superconducting tape conductor according to claim 1, wherein the high temperature superconducting layer comprises a layer thickness of 5 µm to 10 µm.

3. High temperature superconducting tape conductor according to claim 1, wherein the mean height of the terraces of the at least one intermediate layer comprises a range of 50 nm to 200 nm.

4. High temperature superconducting tape conductor according to claim 1, wherein the maximum mean height of the terraces does not exceed 20% of the layer thickness of the high temperature superconducting layer.

5. High temperature superconducting tape conductor according to claim 1, wherein the mean width of the terraces of the at least one intermediate layer is less than 400 nm.

6. High temperature superconducting tape conductor according to claim 1, wherein the metal substrate comprises a sheet made of Hastelloy with a thickness of up to 200 µm.

7. High temperature superconducting tape conductor according to claim 1, wherein the at least one intermediate layer comprises a magnesium oxide layer with a thickness of 1.5 µm to 3.5 µm.

8. High temperature superconducting tape conductor according to claim 1, wherein the high temperature superconducting layer comprises a $RBa_2Cu_3O_7$-layer, wherein R is one element out of the group consisting of the elements Dysprosium (Dy), Gadolinium (Gd), Holmium (Ho) and Yttrium (Y), in particular a high temperature superconducting layer consisting of $DyBa_2Cu_3O_7$.

9. High temperature superconducting tape conductor according to claim 1, wherein the surface of the terraces is essentially parallel to the metal substrate plane.

10. High temperature superconducting tape conductor according to claim 9, wherein the terraces of the at least one intermediate layer are manufactured by anisotropic etching.

* * * * *